United States Patent [19]

Fisher

[11] 4,420,695
[45] Dec. 13, 1983

[54] SYNCHRONOUS PRIORITY CIRCUIT

[75] Inventor: Amnon Fisher, Ramat Hasharon, Israel

[73] Assignee: National Semiconductor Corporation, Santa Clara, Calif.

[21] Appl. No.: 267,381

[22] Filed: May 26, 1981

[51] Int. Cl.³ .................. H03K 17/693; H03K 17/26; H03K 5/153; H03K 5/22

[52] U.S. Cl. .................................... 307/242; 307/243; 307/510; 307/481; 328/109; 328/116; 328/152; 340/825.5

[58] Field of Search ............... 307/357, 304, 510, 518, 307/480, 481, 448, 449, 242, 243; 340/825.5, 825.1; 328/109, 116, 117, 137, 152, 154, 153; 370/85, 86, 87, 88, 89, 90; 179/18 ET; 84/1.01

[56] References Cited

U.S. PATENT DOCUMENTS

| | | | |
|---|---|---|---|
| 2,794,121 | 5/1957 | Bjornson | 328/152 |
| 3,199,081 | 8/1965 | Kok et al. | 340/825.51 |
| 3,573,487 | 4/1971 | Polkinghorn | 307/453 |
| 3,898,618 | 8/1975 | Scheuneman | 340/825.5 |

OTHER PUBLICATIONS

Leventhal, *Introduction to Microprocessors: Software, Hardware, Programming*, Prentice-Hall, Inc. (Pub), Englewood Cliffs, N.J., 1978, pp. 442-445, 478, 479, 482-484.

Primary Examiner—Larry N. Anagnos
Assistant Examiner—David R. Bertelson
Attorney, Agent, or Firm—Brown & Martin

[57] ABSTRACT

A logic circuit is connected to "n" input terminals having a descending order of priority 1, ... k, ... n, and to "n" corresponding output terminals for causing a logical "true" signal to be provided from any given output terminal in response to a logical "true" signal being provided at its corresponding input terminal when a logical "true" signal is not provided at any higher priority input terminal. The logic circuit includes "n" logic elements, each of which is connected between one of the input terminals and its corresponding output terminal and each of which has an enable input and an enable output, wherein the logic elements are interconnected with the enable input of the "kth" logic element being connected to the enable output of the "(k−1)th" logic element. Each logic element is adapted for providing a logical "true" signal to the output terminal connected thereto only in response to both a logical "true" signal at the corresponding input terminal and an enable signal at its enable input, and is further adapted for providing an enable signal at its enable output only if a "true" signal is provided to its enable input, and it does not provide a logical "true" signal to the output terminal connected to the logic element. The current path between the enable input and the enable output in each logic element includes a FET connected in series between the enable input and the enable output, with its gate being coupled to the corresponding input terminal for preventing an enabling signal from being provided from the enable output when a logical "true" signal is provided at the corresponding input terminal. An inhibit circuit responds to an inhibit signal by inhibiting the provision of an enabling signal to the enable input of the first logic element.

2 Claims, 3 Drawing Figures

SYNCHRONOUS PRIORITY CIRCUIT

BACKGROUND OF THE INVENTION

The present invention generally pertains to data processing systems, and is particularly directed to an improved synchronous priority circuit. A synchronous priority circuit, essentially includes "n" input terminals having a descending order of priority 1, ... k, ... n, wherein "k" and "n" are positive integers greater than 1; "n" output terminals corresponding to the "n" input terminals; and a logic circuit connected to the "n" input terminals and the "n" output terminals for causing a logical "true" signal to be provided from any given output terminal in response to a logical "true" signal being provided at its corresponding input terminal when a logical "true" signal is not provided at any priority input terminal. Only a single output terminal may provide a logical "true" output signal at any one time. A truth table for a synchronous priority circuit follows:

| INPUTS | | | | | OUTPUTS | | | | |
|---|---|---|---|---|---|---|---|---|---|
| 1 | 2 | k | n−1 | n | 1 | 2 | k | n−1 | n |
| 1 | x | x | x | x | 1 | 0 | 0 | 0 | 0 |
| 0 | 1 | x | x | x | 0 | 1 | 0 | 0 | 0 |
| . | | | | | . | | | | |
| 0 | 0 | 1 | x | x | 0 | 0 | 1 | 0 | 0 |
| . | | | | | . | | | | |
| 0 | 0 | 0 | 1 | x | 0 | 0 | 0 | 1 | 0 |
| 0 | 0 | 0 | 0 | 1 | 0 | 0 | 0 | 0 | 1 |

0 = FALSE
1 = TRUE
x = DON'T CARE

Prior art synchronous priority circuits with a large number of input terminals either require too much silicon area and two much power, or they are too slow for contemporary VLSI technology.

SUMMARY OF THE INVENTION

The synchronous priority circuit of the present invention overcomes the aforementioned problems by cascading logic elements to implement the priority logic and to decrease the time delay in the critical logic path.

More particularly, the logic of the synchronous priority circuit of the present invention includes "n" logic elements. Each of the logic element is connected between one of the input terminals and its corresponding output terminal. Each of the logic elements has an enable input and an enable output. The logic elements are interconnected with the enable input of the "kth" logic element being connected to the enable output of the "(k−1)th" logic element. Each logic element is adapted for providing a logical "true" signal to the output terminal connected thereto only in response to both a logical "true" signal at the corresponding input terminal and an enable signal at its enable input, and is further adapted for providing an enable signal at its enable output only if a "true" signal is provided to its enable input, and does not provide a logical "true" signal to the output terminal connected to the logic element.

The current path between the enable input and the enable output in each logic element includes a field effect transistor (FET) connected in series between the enable input and the enable output, with its gate being coupled to the corresponding input terminal for preventing an enabling signal from being provided from the enable output when a logical "true" signal is provided at the corresponding input terminal.

An inhibit circuit responds to an inhibit signal by inhibiting the provision of an enabling signal to the enable input of the first logic element.

DESCRIPTION OF THE PREFERRED EMBODIMENT

Figure 1:
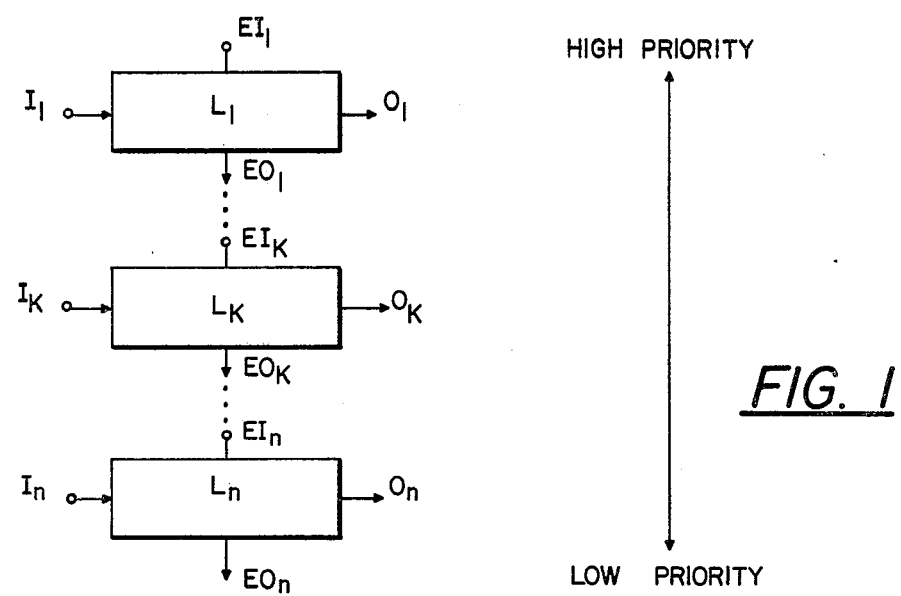
FIG. 1 is a block diagram of the synchronous priority circuit of the present invention.

Referring to FIG. 1, the preferred embodiment of the synchronous priority circuit of the present invention includes "n" input terminals $I_1, \ldots I_k, \ldots I_n$; "n" output terminals $O_1, \ldots O_k, \ldots O_n$; and "n" logic elements $L_1, \ldots L_k, \ldots L_n$. Each of the logic elements has an enable input $EI_1, \ldots EI_k, \ldots EI_n$; and an enable output $EO_1, \ldots EO_K, \ldots EO_n$. The order of priority of the input terminals descends from $I_1$ to $I_n$. The logic elements are interconnected with the enable input of the "kth" logic element being connected to the enable output of the "(k−1)th" logic element. This statement should be interpreted as also being applicable to the connection of the enable input of the "nth" logic element to the enable output of the "(n−1)th" logic element.

Referring also the truth table, each logic element $L_1, \ldots L_k, \ldots L_n$ of the circuit of FIG. 1 is adapted for providing a logical "true" signal to the output terminal connected thereto $O_1, \ldots O_k, \ldots O_n$ only in response to both a logical "true" signal at the corresponding input terminal $I_1, \ldots I_k, \ldots I_n$ and an enable signal at its enable input $EI_1, \ldots EI_k, \ldots EI_n$; and is further adapted for providing an enable signal at its enable output $EO_1, \ldots EO_k, \ldots EO_n$ only if a "true" signal is provided to its enable input, and does not provide a logical "true" signal to the output terminal connected to the logic element. Accordingly, the truth table is satisfied by the synchronous priority circuit of FIG. 1.

Figure 2:
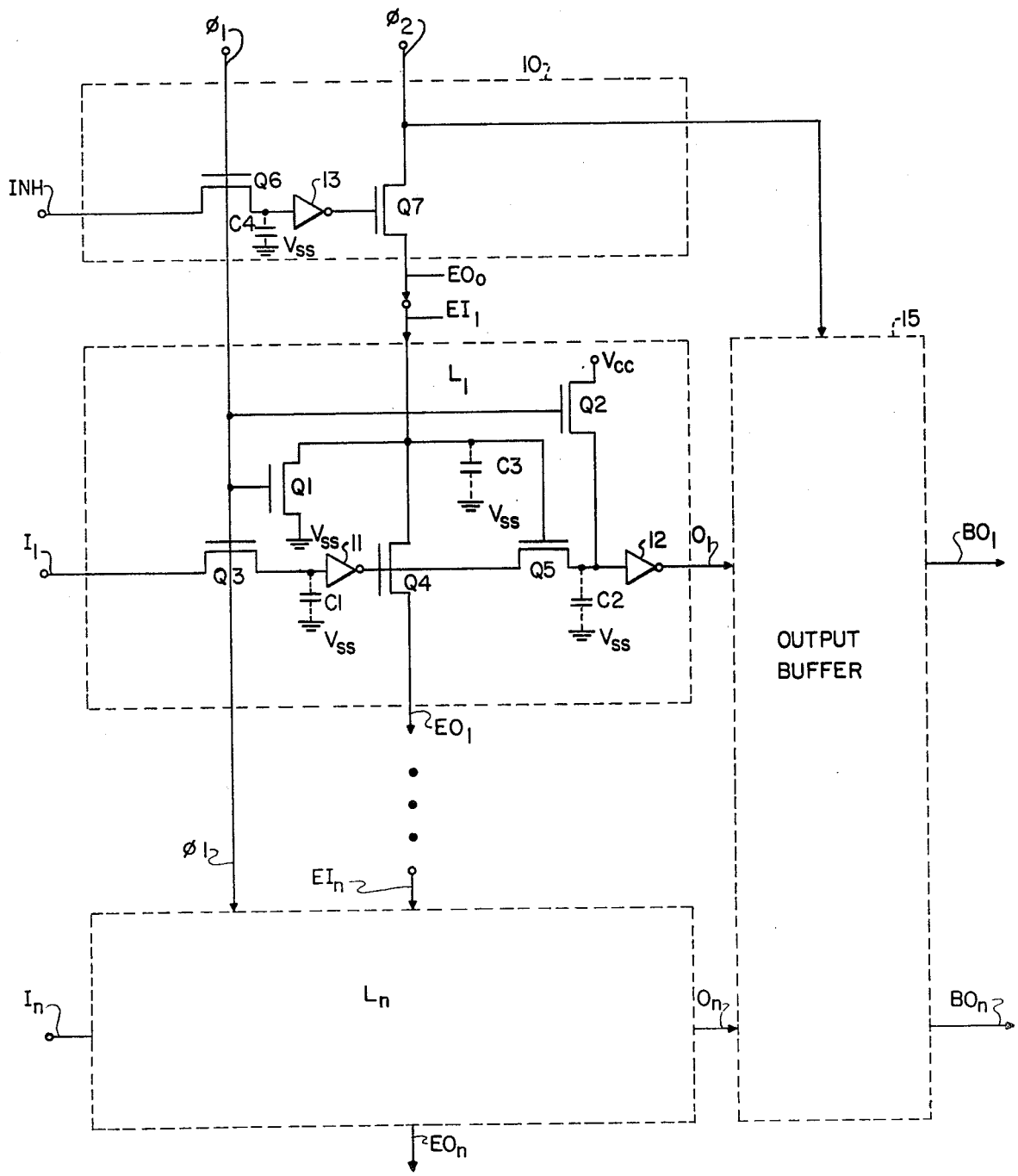
FIG. 2 is a schematic circuit diagram of a typical logic element included in the synchronous priority circuit of FIG. 1, together with enabling and inhibiting circuits connected thereto.

A preferred embodiment of a typical logic element is shown in FIG. 2, together with enabling and inhibiting circuits 10 connected to the first logic element $L_1$. The first logic element $L_1$ includes five enhancement-mode NMOS field effect transistors (FET's) Q1, Q2, Q3, Q4 and Q5 and two inverters 11 and 12, and utilizes the stray input capacitances C1, C2 and C3 of various circuit components for charge storage. The capacitance C1 is the stray input-gate-to-circuit-ground capacitance of the inverter 11; the capacitance C2 is the stray input-gate-to-circuit-ground capacitance of the inverter 12 and; the capacitance C3 is the stray input-gate-to-circuit-ground capacitance of the FET Q5.

The enabling and inhibiting circuits 10 include two enhancement mode NMOS FETs Q6 and Q7 and an inverter 13, and utilizes the stray input-gate-to-circuit-ground capacitance C4 of the inverter 13 for charge storage. The enabling and inhibiting circuits 10 further include an inhibit terminal INH, first clock signal terminal ∅1, a second clock signal terminal ∅2, and an enable output EO$_o$. The enable output EO$_o$ of the enabling and inhibiting circuits 10 is connected to the enable input EI$_1$ of the first logic element L$_1$. The FET Q6 has its gate connected to the first clock signal terminal ∅1. The FET Q6 is connected in series between the inhibit terminal INH and the input of the inverter 13. The FET Q7 has its gate connected to the output of the inverter 13. The FET Q7 is connected in series between the second clock input signal terminal ∅2 and the enable output EO$_o$.

The first clock signal terminal ∅1 is connected in common to all of the logic elements L$_1$, ... L$_k$, ... L$_n$.

Referring to the first logic element L$_1$, the FET Q1 has its gate connected to the first clock signal terminal ∅1. The FET Q1 is connected in series between the enable input EI$_1$ and circuit ground which is at voltage potential V$_{SS}$. The FET Q2 has its gate connected to the first clock signal terminal ∅1. The FET Q2 is connected in series between a supply voltage terminal V$_{CC}$ and the input to the inverter 12. The FET Q3 has its gate connected to the first clock signal terminal ∅1. The FET Q3 is connected in series between the first input terminal I$_1$ and the input to the inverter 11. The FET Q4 has its gate connected to the output of the inverter 11. The FET Q4 is connected in series between the enable input EI$_1$ and the enable output EO$_1$. The FET Q5 has its gate connected to enable input EI$_1$. The FET Q5 is connected in series between the output of the inverter 11 and the input of the inverter 12. The output of the inverter 12 is connected to the output terminal O$_1$.

When a "high" signal is provided at the first clock signal terminal ∅1, the FET Q3 is rendered conductive to enable any true (high) input signal that may be provided at the input terminal I$_1$ to be latched across the capacitance C1; the FET Q2 is rendered conductive to cause the capacitance C2 to be charged to the level of the supply voltage V$_{CC}$; and the FET Q1 is rendered conductive to cause the capacitance C3 to be discharged to circuit ground, to thereby render the FET Q5 nonconductive. While the FET Q5 is non-conductive, the capacitance C2 is unaffected by the charge across the capacitance C1 and the inverter 11. While a "high" signal is provided to the first clock signal terminal ∅1, a complementary "low" signal is provided to the second clock signal terminal ∅2.

When a "high" signal is provided at the first clock signal terminal ∅1, the FET Q6 in the enabling and inhibiting circuits 10 is rendered conductive to enable the input signal that is provided at the inhibit terminal INH to be latched across the capacitance C4. The inverter 13 inverts the latched input signal and provides such inverted signal at its output during the next phase while a "high" signal is provided at the second clock signal terminal ∅2.

Assuming that a "low" signal was provided to the inhibit terminal INH while a "high" signal was provided at the first clock signal terminal ∅1, then during the next phase, when a "high" signal is provided to the second clock signal terminal ∅2, an enabling (high) signal is provided to the enable input EI$_1$ to cause the capacitance C3 to be charged to thereby render the FET Q5 conductive; and the FET Q2 is rendered non-conductive by the complementary "low" signal provided at the first clock signal terminal ∅1. The capacitance C2 then will either be discharged to the circuit ground voltage potential V$_{SS}$ or remain charged to the supply voltage V$_{CC}$, depending upon whether or not the capacitance C1 was charged in response to a logical "true" input signal provided at the input terminal I$_1$ during the preceding interval while a "high" signal was provided to the first clock signal terminal ∅1.

When a "high" signal is provided to the inhibit terminal INH, a non-enabling (low) signal is provided to the enable input EI$_1$ and thereby maintains the FET Q5 non-conductive. For so long as the FET Q5 is non-conductive, the capacitance C2 remains charged and a logical "false" (low) signal is provided by the inverter 12 to the output terminal O$_1$.

Also, whenever a non-enabling signal is provided to the enable input EI$_1$, a non-enabling signal also will be provided from the enable output EO$_1$. In addition, non-enabling signal is provided at the enable output EO$_1$ whenever the FET Q4 is rendered non-conductive in response to a logical "true" input signal latched by the capacitance C1 being inverted by the inverter 11. An enabling signal is provided at the enabling output EO$_1$ only when an enabling signal is provided at the enabling input EI$_1$ and a logical "false" signal is provided at the input terminal I$_1$.

An exemplary operation of the logic circuit L$_1$ is described with reference to the timing waveform illustrated in FIG. 3.

Complementary first and second clock signals are applied to the clock signal terminals ∅1 and ∅2 respectively. The first clock signal applied to the terminal ∅1 is "high" only during odd-numbered intervals. 1, 3, ... ; and the second clock signal applied to the terminal ∅2 is "high" only during even-numbered intervals, 0, 2, 4, ....

Initially, a "high" level inhibit signal is applied to the inhibit terminal INH. The state of the inhibit signal is determined by an external source connected to the inhibit terminal INH. Also, the input signal provided to input terminal I$_1$ initially is "false" or "low," whereby a "high" level signal is provided across the capacitance C2.

During interval No. 2, the signal at the input terminal I$_1$ changes state from "low" to "high"; and at the beginning of the next interval (No. 3) when a "high" clock signal is provided at the first clock signal terminal ∅1 to thereby turn on the FET Q3, the "high" input signal is latched across the capacitance C1.

Figure 3:
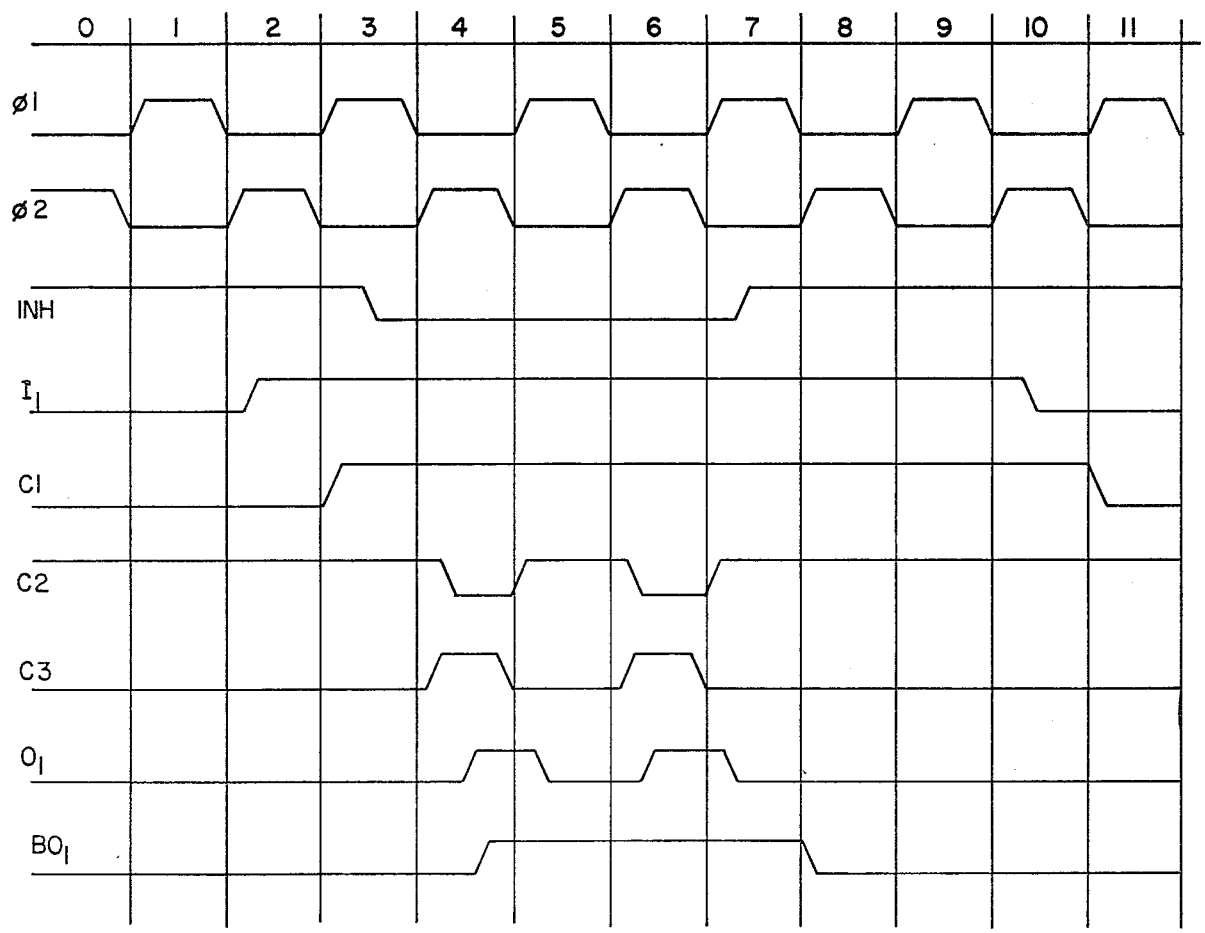
FIG. 3 illustrates the timing of the waveforms of the signals provided in the circuits of FIG. 2 during an exemplary operation thereof.

In the example illustrated in FIG. 3, during interval No. 3, the level of the inhibit signal applied to the inhibit terminal INH coincidentally goes from "high" to "low" subsequent to the signal provided to the input terminal I$_1$ going from "low" to "high."

During interval No. 4 with the inhibit signal level having gone "low," a "high" enabling signal is received at enable input EI$_1$ from the second clock signal terminal ∅2 and placed across the capacitance C3, to thereby turn on the FET Q5. When the FET Q5 is turned on, a "low" level signal is provided from the output of the inverter "11" to the input of the inverter "12" and thereby discharges the capacitance C2 to a "low" level. This in turn causes a "high" level output signal to be provided from the output of the inverter 12 onto the first output terminal O$_1$.

The "low" level output signal from the inverter 11 also turns off the FET Q4 and prevents the "high" level enabling signal received at the enabling input EI$_1$, from being applied to the enabling output EO$_1$.

During interval No. 5, with a "high" level clock signal applied to terminal ∅1 and a "low" level clock signal applied to terminal ∅2, the FET Q5 is turned off and a "high" level signal is again placed across the capacitance C2 at the input of the inverter 12, whereby the signal level at the first output terminal $O_1$ again becomes "low" or false.

During interval No. 6, the operations that took place during interval No. 4 are repeated.

However, in comparing the waveform of the signal at the first output terminal $O_1$ with the waveform of the signal at the first input terminal $I_1$ during the intervals after the inhibit signal level went low. It is noted that there is a lack of correspondence due to the signal at the first output terminal $O_1$ reverting to a "low" level during the intermediate odd numbered interval (No. 5) while the first clock signal at the terminal $\emptyset 1$ was high and the second clock signal at the terminal $\emptyset 2$ was low. Therefore, an output buffer 15 is connected to the output terminals $O_1, \ldots O_n$ of the logic circuit. The output buffer 15 contains corresponding output terminals $BO_1, \ldots BO_n$ and is connected to the second clock signal input terminal $\emptyset 2$ for sampling the signal levels of the output terminals of the logic circuit $O_1, \ldots O_n$ for transfer to the corresponding buffer output terminal $BO_1, \ldots BO_n$ during the even numbered intervals when a "high" level clock signal is provided at the terminal $\emptyset 2$. As a result, the waveform of the signal at the first buffer output terminal $BO_1$ corresponds to the waveform of the signal at the first input terminal $I_1$ during the intervals while the level of the inhibit signal at the inhibit terminal INH is "low."

During interval No. 7, the inhibit signal level again becomes "high" and the signal across the capacitance C2 at the input of the inverter 12 also becomes "high," whereby the signal at the first output terminal $O_1$ becomes low and remains low. During interval No. 8, the output buffer samples the signal at the first output terminal $O_1$ and causes the signal at the first buffer output terminal $BO_1$ to also go low.

During interval No. 10, the signal at the first input terminal $I_1$ goes low, thereby causing the capacitance C1 to be discharged at the beginning of the next odd-numbered interval (No. 11) when the FET Q3 is turned on.

I claim:

1. A synchronous priority circuit, comprising "n" input terminals having a descending order of priority 1 ..., k, ... n, wherein "k" and "n" are positive integers greater than 1;
   "n" output terminals corresponding to the "n" input terminals; and
   a logic circuit connected to the "n" input terminals and the "n" output terminals for causing a logical "true" signal to be provided from any given output terminal in response to a logical "true" signal being provided at its corresponding input terminal when a logical "true" signal is not provided at any higher priority input terminal, wherein the logic circuit comprises
   "n" logic elements, each of which is connected between one of the input terminals and its corresponding output terminal and each of which has an enable input and an enable output, wherein the logic elements are interconnected, with the enable input of the "kth" logic element being connected to the enable output of the "(k−1)th" logic element;
   wherein each logic element provides a logical "true" signal to the output terminal connected thereto only in response to both a logical "true" signal at the corresponding input terminal and an enable signal at its enable input, and further provides an enable signal at its enable output only if a "true" signal is provided to its enable input, and it does not provide a logical "true" signal to the output terminal connected to the logic element; and
   a current path between the enable input and the enable output in each logic element wherein the current path includes a field effect transistor connected in series between the enable input and the enable output, with its gate being coupled to the corresponding input terminal for preventing an enabling signal from being provided from the enable output when a logical "true" signal is provided at the corresponding input terminal.

2. A synchronous priority circuit, comprising "n" input terminals having a descending order of priority 1 ..., k, ... n, wherein "k" and "n" are positive integers greater than 1;
   "n" output terminals corresponding to the "n" input terminals; and
   a logic circuit connected to the "n" input terminals and the "n" output terminals for causing a logical "true" signal to be provided from any given output terminal in response to a logical "true" signal being provided at its corresponding input terminal when a logical "true" signal is not provided at any higher priority input terminal, wherein the logic circuit comprises
   "n" logic elements, each of which is connected between one of the input terminals and its corresponding output terminal and each of which has an enable input and an enable output, wherein the logic elements are interconnected, with the enable input of the "kth" logic element being connected to the enable output of the "k−1)th" logic element;
   wherein each logic element provides a logical "true" signal to the output terminal connected thereto only in response to both a logical "true" signal at the corresponding input terminal and an enable signal at its enable input, and further provides an enable signal at its enable output only if a "true" signal is provided to its enable input, and it does not provide a logical "true" signal to the output terminal connected to the logic element;
   means for providing an enable signal to the enable input of the first logic element;
   means for inhibiting the provision of an enable signal to the enable input of the first logic element; and
   a current path between the enable input and the enable output in each logic element wherein the current path includes a field effect transistor connected in series between the enable input and the enable output, with its gate being coupled to the corresponding input terminal for preventing an enabling signal from being provided from the enable output when a logical "true" signal is provided at the corresponding input terminal.

* * * * *